(12) United States Patent
Brown et al.

(10) Patent No.: US 7,666,735 B1
(45) Date of Patent: Feb. 23, 2010

(54) METHOD FOR FORMING SEMICONDUCTOR DEVICES WITH ACTIVE SILICON HEIGHT VARIATION

(75) Inventors: David E. Brown, Pleasant Valley, NY (US); Hans Van Meer, Fishkill, NY (US); Sey-Ping Sun, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 709 days.

(21) Appl. No.: 11/053,935

(22) Filed: Feb. 10, 2005

(51) Int. Cl.
*H01L 21/8238* (2006.01)

(52) U.S. Cl. .................. 438/225; 438/259; 438/270; 438/362; 438/576

(58) Field of Classification Search .......... 438/424, 438/439, 637–638, 672–673, 700, 259, 270–274, 438/297–298, 362–363, 425–427, 576–589, 438/224–225
See application file for complete search history.

(56) References Cited

U.S. PATENT DOCUMENTS

| | | | | |
|---|---|---|---|---|
| 2004/0248373 | A1* | 12/2004 | Park | 438/424 |
| 2005/0145983 | A1* | 7/2005 | Bertin et al. | 257/530 |
| 2005/0148154 | A1* | 7/2005 | Ogawa | 438/424 |
| 2006/0258177 | A1* | 11/2006 | Kastenmeier et al. | 438/798 |

* cited by examiner

*Primary Examiner*—Dung A. Le
(74) *Attorney, Agent, or Firm*—McDermott Will & Emery LLP

(57) ABSTRACT

A method for forming different active thicknesses on the same silicon layer includes masking the silicon layer and exposing selected regions of the silicon layer. The thickness of the silicon layer at the exposed regions is changed, either by adding silicon or subtracting silicon from the layer at the exposed regions. Once the mask is removed, the silicon layer has regions of different active thicknesses, respectively suitable for use in different types of devices, such as diodes and transistors.

3 Claims, 3 Drawing Sheets

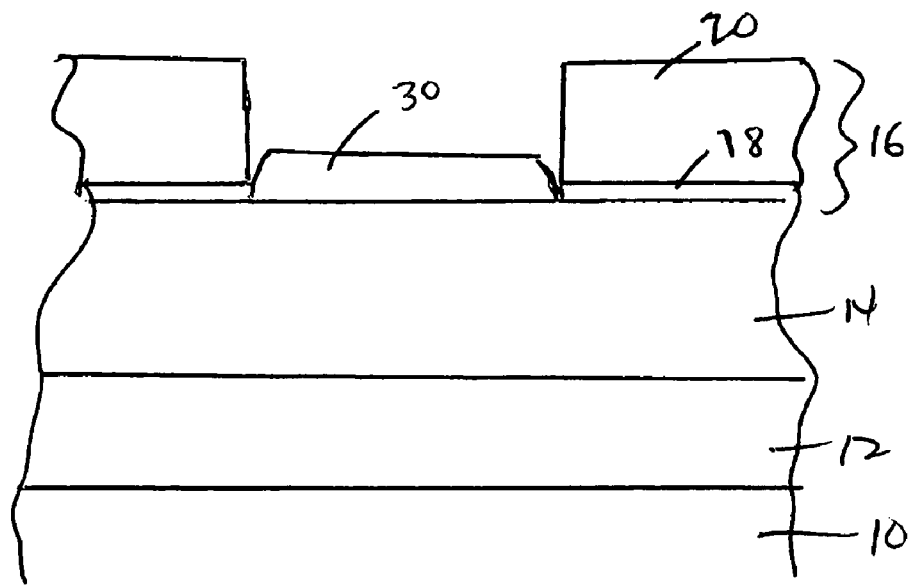
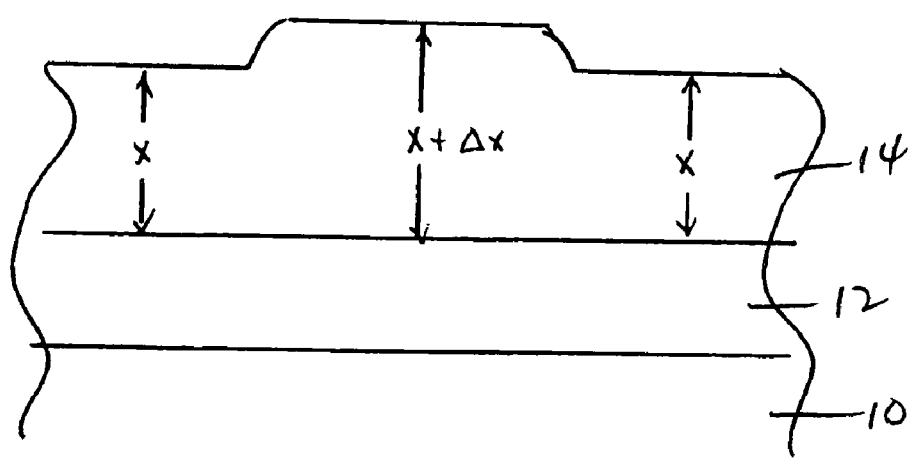

METHOD FOR FORMING SEMICONDUCTOR DEVICES WITH ACTIVE SILICON HEIGHT VARIATION

FIELD OF THE INVENTION

The present invention relates to the manufacturing of semiconductor devices, and more particularly, to the providing of different active silicon thicknesses on the same substrate.

BACKGROUND OF THE INVENTION

Over the last few decades, the semiconductor industry has undergone a revolution by the use of semiconductor technology to fabricate small, highly-integrated electronic devices, and the most common semiconductor technology presently used is silicon-based. A large variety of semiconductor devices have been manufactured having various applications in numerous disciplines. One silicon-based semiconductor device is a medal-oxide-semiconductor (MOS) transistor. The MOS transistor is one of the basic building blocks of most modern electronic circuits. Importantly, these electronic circuits realize improved performance and lower costs, as the performance of the MOS transistors increased in as manufacturing costs are reduced.

A typical MOS device includes a bulk semiconductor substrate in which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. A typical MOS device is symmetrical, and the source and drain are interchangeable. Whether a region acts as the source or drain typically depends on the respective applied voltages and the type of device being made. The collective term source/drain region is used herein to generally describe an active region used for the formation of either a source or drain.

As an alternative to forming a MOS device on a bulk semiconductor substrate, a semiconductor layer can also be formed on an insulating substrate, or over an insulation layer formed in a semiconductor substrate. The insulating layer is often referred to as a "buried oxide layer", since oxide is typically employed as the insulation layer. This technology is generally referred to as silicon-on-insulator (SOI) technology. If silicon germanium is employed as the semiconductor layer formed on the insulation layer, the technology is referred to as SGOI technology. In the following, both of these different technologies will be referred to as simply SOI technology for ease of discussion.

SOI technology offers potential advantages over bulk materials for the fabrication of high-performance integrated circuits. For example, dielectric isolation and reduction of parasitic capacitance improve circuit performance. Also, compared to bulk circuits, SOI is more resistant to radiation.

It is known that diode ideality is impacted by defects at the buried oxide/silicon interface. Consequently, the thinner the silicon layer, the less ideal is the diode. In thin silicon layers, transport mechanisms other than drift diffusion can dominate the diode, causing a defect-generated leakage circuit.

Although a thicker silicon layer allows for improved diode ideality, it is still important to provide thin regions of silicon for active regions of devices, such as transistors.

SUMMARY OF THE INVENTION

There is a need for a method of providing different active silicon thicknesses on the same SOI or SGOI substrates so as to avoid compromising either diode ideality or device performance by forming active silicon thicknesses of the same thickness throughout the substrate.

This and other needs are met by embodiments of the present invention which provide a method of forming a silicon layer with different active thicknesses on a single semiconductor substrate, comprising the steps of providing a mask layer on a silicon layer, this silicon layer having a first thickness. An opening is created in the mask layer to expose a region of the silicon layer. The thickness of the silicon layer at the exposed region is changed to a second thickness that is different from the first thickness.

In certain embodiments, the thickness is changed to add silicon to the silicon layer of the exposed region, and in certain other embodiments, the thickness is changed by removing silicon at the exposed region. As an example, the removal of silicon at the exposed region involves local oxidation of silicon (LOCOS). In certain other embodiments, the addition of silicon includes selective epitaxial growth (SEG) at the exposed region.

The changing of the thickness of the silicon layer at an opening in the mask layer allows different active thicknesses to be created on a single semiconductor substrate, such as on an SOI or SGOI substrate. In turn, diode ideality may be maintained, as well as a thinness of active regions in other types of devices, such as transistors.

The earlier stated needs are met by other aspects of the present invention which provide a method of forming first and second device types having different active thicknesses in a same silicon layer. This method comprises the steps of masking the silicon layer and exposing a region of the silicon layer, and changing thickness of the silicon layer at the exposed region of the silicon layer to create regions of first thickness and regions of second thickness in the silicon layer. First device types are formed at the first thickness regions and second device types are formed at the second thickness regions.

The foregoing and other features, aspects and advantages of the present invention will become more apparent from the following detailed description of the present invention when taken in conjunction with the accompanying drawings.

DESCRIPTION OF THE DRAWINGS

FIG. 6 depicts the structure of FIG. 3 following the addition of silicon to the silicon layer at the exposed region, in accordance with other embodiments of the present invention.

FIG. 7 shows the structure of FIG. 6 after the removal of a mask layer to form different active thicknesses in accordance with other embodiments of the present invention.

DETAILED DESCRIPTION OF THE INVENTION

The present invention addresses and solves problems related to the formation of diodes and transistors or other devices on the same substrate, and in particular, to problems related to the active silicon thicknesses on the same substrate. In order to maintain diode ideality, and at the same time provide for thin active regions in other types of devices, such as transistors, the present invention provides a method of forming different active silicon thicknesses on the same substrate. This is achieved, in the present invention, at least in part, by forming a mask layer on a silicon layer. The mask layer is then patterned and etched to create exposed regions of the silicon. Silicon is either added to the silicon layer at the region exposed by the opening of the mask layer, or removed from the exposed region. Once the mask layer is removed, a layer of silicon remains having different active thicknesses. Devices of a first type, such as diodes, may be formed in the regions of silicon having a first thickness, while devices of a second type, such as transistors, may be formed in the regions of silicon having a lesser thickness. This allows the diode ideality to be maintained by employing a thicker layer of silicon, while also allowing the active regions of the other types of devices, such as transistors, to be kept relatively thin to improve device performance.

Figure 1:
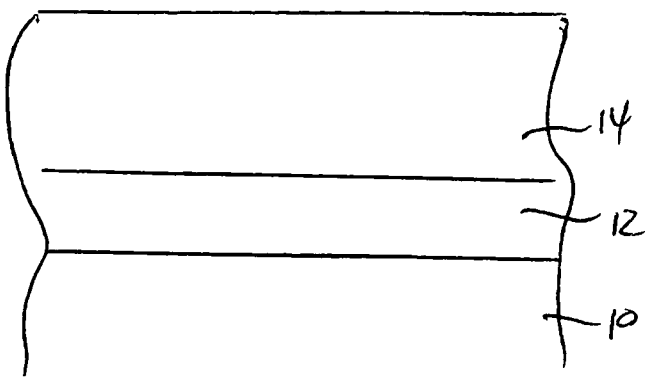
FIG. 1 is a schematic cross-sectional view of a portion of a semiconductor wafer constructed in accordance with embodiments of the present invention during one phase of manufacture.
Figure 2:
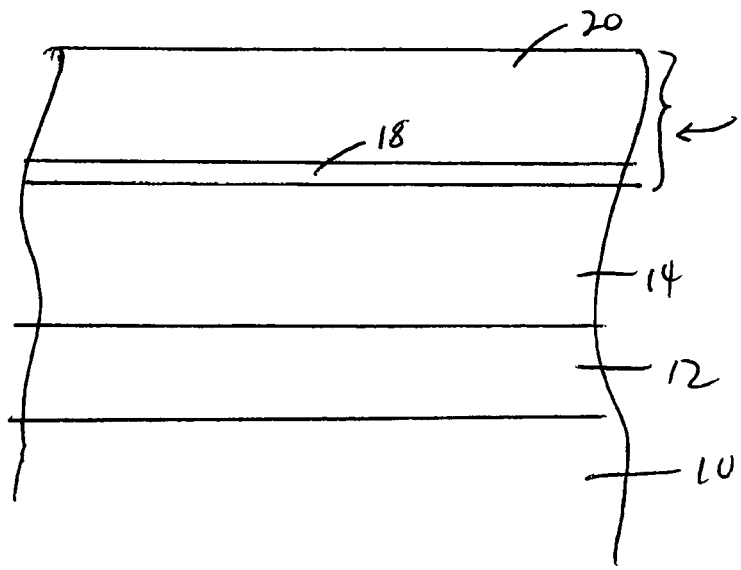
FIG. 2 shows the structure of FIG. 1 following the deposition of a mask layer over the silicon layer in accordance with embodiments of the present invention.
Figure 3:
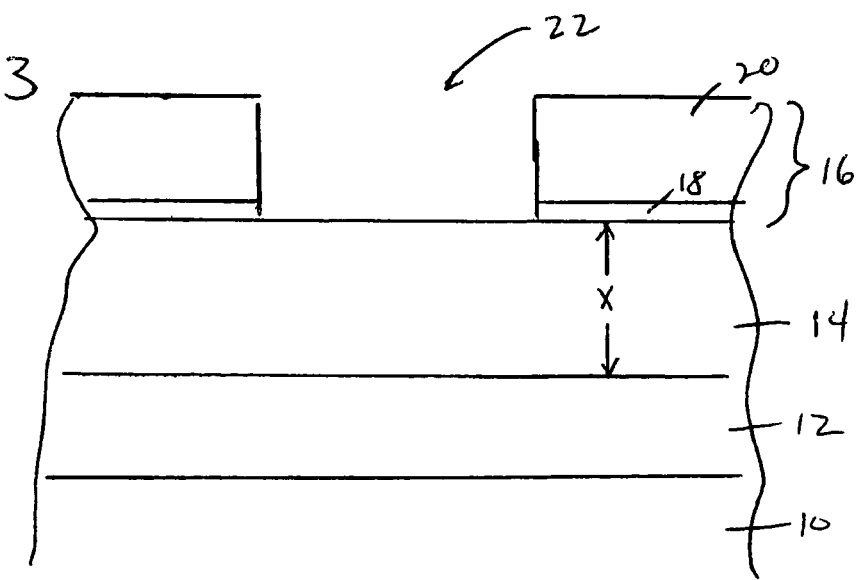
FIG. 3 depicts the structure of FIG. 2 following a mask and etch procedure to expose regions of the silicon layer, in accordance with embodiments of the present invention.
Figure 4:
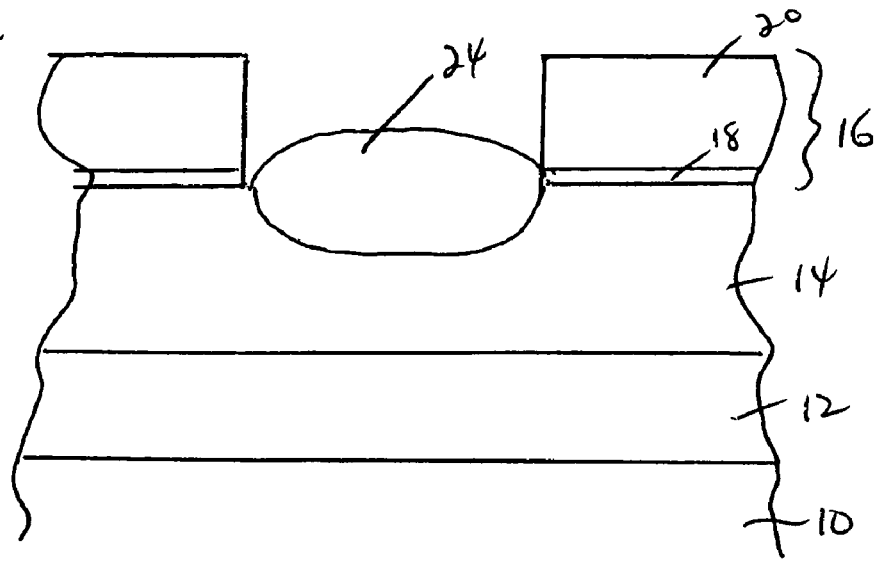
FIG. 4 shows the arrangement of FIG. 3 following the formation of oxide in the exposed regions according to certain embodiments of the invention.
Figure 5:
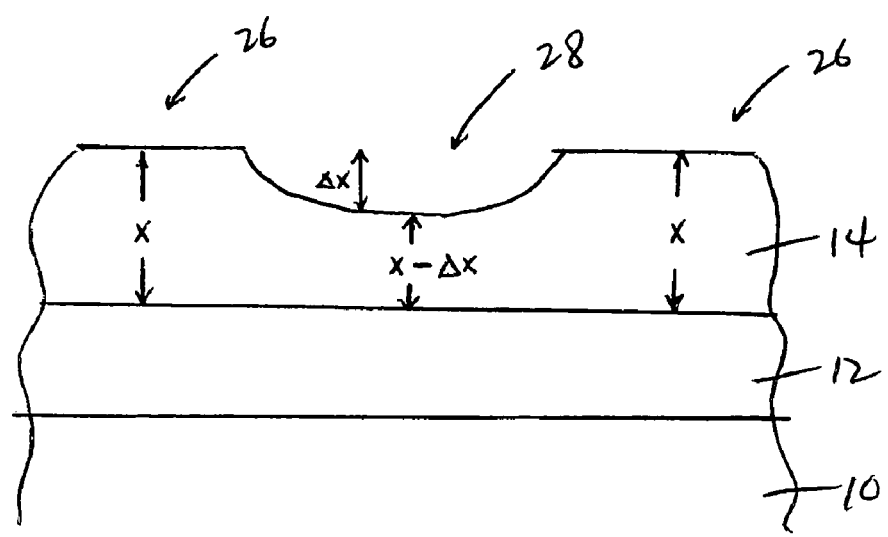
FIG. 5 depicts the structure of FIG. 4 following the removal of the oxide to create different active thicknesses of silicon in accordance with certain embodiments of the invention.

FIGS. 1-3 depict sequential steps in the formation of different active thicknesses in accordance with the embodiments of the present invention. FIGS. 4 and 5 show the removal of silicon to form the different active thicknesses in accordance with certain embodiments of the present invention, following the steps of FIGS. 1-3. FIGS. 6 and 7 depict the steps in another embodiment of the present invention following the formation steps depicted in FIGS. 1-3.

FIG. 1 depicts an arrangement in which a substrate 10, such as a silicon layer, has an insulation layer 12 formed thereon. The insulation layer 12 may be a buried oxide (BOX) layer, for example. A semiconductor layer 14 is formed on the insulation layer 12 and may be deposited by any conventional methodology to a thickness x. Conventional materials may be employed in the semiconductor layer 14, such as silicon or silicon germanium. For ease of reference, the term "silicon layer" will be used to refer to layer 14. In certain embodiments of the invention, the silicon layer 14 is not provided on an insulating layer, but rather is a bulk silicon layer.

Methods for forming the wafer comprising substrate 10, insulation layer 12, and silicon layer 14, is well known, and details regarding the formation of the same will not be described so as not to obscure the method of the present invention. However, one such technique that may be employed is wafer bonding in which the SOI structure is bonded onto a substrate 10.

In FIG. 2 a mask layer 16 is formed on the silicon layer 14. The mask layer may be any conventional material suitable for masking, or a combination of materials. For example, in the exemplary embodiment of FIG. 2, the mask layer 16 is formed of a relatively thin layer of oxide 18, followed by a thicker, nitride layer 20. Conventional methodologies may be employed to deposit the mask layer 16.

Following the formation of the mask layer 16, a mask and etch procedure is performed to create exposed regions 22 of the silicon layer 14. Conventional methodology for masking and etching includes forming a photoresist layer, selectively irradiating the photoresist layer employing a photolithographic system, developing the photoresist layer, and removing the irradiated portions of the photoresist to provide the opening in the mask layer 16. The thickness of the silicon layer 14 at the exposed regions 22 have an initial thickness of x, as in the mask portions of the silicon layer 14. The thickness x is changed, either by removal or addition of silicon, in different embodiments of the invention, at the exposed regions 22.

FIGS. 4 and 5 show the removal of silicon to change the thickness of the silicon of the exposed region to a second thickness $(x-\Delta x)$ that is less than the initial thickness x of the silicon layer 14.

In the embodiment of FIGS. 4 and 5, a localized oxidation of silicon process is performed to convert a controlled portion of the silicon layer 14 at the exposed region 22 to oxide. Hence, in this embodiment, the silicon layer 14, at the exposed region 22, is converted to oxide to a depth of $\Delta x$.

Following the conversion of oxide, the mask layer 16 may be removed by any conventional methodology, and the oxide 24 formed at the exposed region 22 is also removed. A single etching step, such as the use of a buffered oxide etch, may be employed to remove the oxide 24 and at least the oxide layer 18 of the mask layer 16.

Once the oxide 24 is removed from the silicon layer 14 at the exposed region 22, and the mask layer 16 removed, a silicon layer 14 having different active thicknesses x and $(x-\Delta x)$ are created. The thicker regions 26, having a thickness of x, for example, are particularly suitable for diodes as they are less likely to be impacted by defects at the interface of the current oxide/silicon. At the same time, active regions 28 of silicon are formed in the silicon layer 14 that have a lesser thickness, $x-\Delta x$, and maybe particularly suitable for use in other types of devices, such as transistors. Hence, in the same silicon layer 14, diodes in which diode ideality is maintained and active regions for other types of devices that are thinner are provided. This avoids compromising the performance of either diodes or other types of devices formed on the same silicon layer.

FIGS. 6 and 7 show an alternate embodiment of the present invention in which silicon is added to the silicon layer 14, rather than removed. In this case, the thickness x represents the initial thickness but will be employed as the thinner regions of the silicon layer for active devices, such as transistors. Hence, the value for x, the initial value of the silicon layer 14, should not be considered to be the same in FIGS. 4 and 6.

FIG. 6 depicts the formation of an added silicon region 30 at the exposed region 22. The added silicon region 30 increases the thickness of the silicon layer 14 at the exposed region 22 to a thickness of $x+\Delta x$. In certain embodiments of the invention, silicon is added by a selective epitaxial growth process, such as known to those of ordinary skill in the art. Silicon is grown at the exposed regions 22 of the silicon layer 14, and not on those regions masked by the mask layer 16.

Following the formation of the added silicon region 30, the mask layer 16 is removed by conventional etching techniques to leave a silicon layer 14 having regions 32 and 34 of different active thicknesses. The thinner regions 32, having a thickness of x, for example, are more suitable for devices demanding thinner active regions, such as transistors. The thicker active regions 34, having a thickness of x+Δx, for example, are more suitable for diodes.

In subsequent processing steps, not shown, devices of first and second types, such as diodes and transistors, are formed in the silicon layer 14 of different active thicknesses depicted in FIGS. 5 and 7. Conventional methodologies may be employed to create such devices.

The present invention thus provides for varying the active silicon height in a silicon layer, which improves diode ideality while maintaining thinness of active regions in other types of devices.

Although the present invention has been described and illustrated in detail, it is to be clearly understood that the same is by way of illustration and example only and it is not to be taken by way of limitation, the scope of the present invention being limited only by the terms of the appended claims.

What is claimed is:

1. A method of forming first and second device types having different active thicknesses in a same silicon layer, comprising the steps:

masking the silicon layer and exposing a region of the silicon layer;

changing thickness of the silicon layer at the exposed region of the silicon layer to create regions of first thickness and regions of second thickness in the silicon layer; and forming the first device types at the first thickness regions and the second device types at the second thickness regions, wherein the first device types are diodes and the second device types are transistors.

2. The method of claim 1, wherein the step of changing the thickness includes removing silicon at the exposed region to form the second thickness regions at the exposed region and the first thickness regions at masked regions of the silicon layer.

3. The method of claim 2, wherein the step of removing silicon includes performing local oxidation of silicon at the exposed region to consume silicon and form oxide at the exposed region, and removing the oxide.

\* \* \* \* \*